US006992330B2

(12) United States Patent
Fery et al.

(10) Patent No.: US 6,992,330 B2
(45) Date of Patent: Jan. 31, 2006

(54) ENCAPSULATION OF "TOP-EMITTING" OLED PANELS

(75) Inventors: Christophe Fery, Rennes (FR); Gunther Haas, Saint Grégoire (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/686,890

(22) Filed: Oct. 16, 2003

(65) Prior Publication Data

US 2004/0075115 A1 Apr. 22, 2004

(30) Foreign Application Priority Data

Oct. 17, 2002 (FR) .................................. 02 12928

(51) Int. Cl.
*H01L 27/15* (2006.01)

(52) U.S. Cl. ............................ 257/79; 34/335; 257/99; 257/100; 313/509; 313/512

(58) Field of Classification Search ................. 34/335; 257/99, 100; 313/509, 512
See application file for complete search history.

(56) References Cited

U.S. PATENT DOCUMENTS

| 4,357,557 A | * | 11/1982 | Inohara et al. ............... 313/509 |
| 5,239,228 A | * | 8/1993 | Taniguchi et al. ............ 313/512 |
| 6,470,594 B1 | * | 10/2002 | Boroson et al. ............... 34/335 |
| 2002/0006654 A1 | | 5/2002 | Park et al. ..................... 345/76 |

OTHER PUBLICATIONS

Patent Abstract of Japan, vol. 2002, No. 12, Dec. 12, 2002 & JP 2002 231441 A, Aug. 16, 2002.
Patent Abstract of Japan, vol. 2002, No. 6, Jun. 4, 2002 & JP 2002 050471 A, Feb. 15, 2002.
Patent Abstracts of Japan, vol. 1999, No. 5, May 31, 1999 & JP 11 054285 A, Feb. 26, 1999.

* cited by examiner

*Primary Examiner*—Mai-Huong Tran
(74) *Attorney, Agent, or Firm*—Joseph S. Tripoli; Harvey D. Fried; Patricia A. Verlangieri

(57) ABSTRACT

Image display panel of the "top-emitting" OLED type having, on the internal face of the front plate, which plate faces the observer, an array of cavities or grooves that are distributed between the light-emitting cells and contain an absorbent agent intended to absorb, in particular, traces of oxygen and/or water vapor liable to degrade the organic electroluminescent cells. The lifetime of the panels is thereby improved.

6 Claims, 5 Drawing Sheets

ENCAPSULATION OF "TOP-EMITTING" OLED PANELS

FIELD OF THE INVENTION

The invention relates to an image-display and/or lighting panel comprising two plates, a front plate facing the observer and a rear plate, these plates being sealed and leaving a sealed space between them, an array of cells that are capable of emitting light through the front plate and are distributed between these plates, and an active absorbent agent in this sealed space.

BACKGROUND OF THE INVENTION

Document EP1143539 discloses a panel of this type; the cells of this panel include an organic electroluminescent layer in equilibrium with the atmosphere of the sealed space. Since this electroluminescent layer is organic, it is particularly sensitive to any trace of oxygen and/or water vapour in this space. Oxygen and/or water vapour disturb and degrade the constituent materials of the organic electroluminescent layer, especially its light emission capabilities, reducing the quality of the display and/or the lifetime of the panel.

In that document, the front plate (Ref. 12 in FIG. 4 of the document) serves as substrate for the electroluminescent layer, and the absorbent agent (Ref. 50 in FIG. 4 of the document) is distributed uniformly over the surface of the rear plate, which serves as the external part of the casing. Since the emitted light passes through the substrate, this type of cell is usually termed "back-emitting". In contrast, the prior art discloses panels whose cells are turned "top-emitting", which means that the emitted light passes not through the substrate but, on the contrary, through the plate on the opposite side from the substrate. In this case, the presence of an absorbent agent on this opposite plate, as in document EP 1 143 539, would impede the passage of the emitted light and would greatly reduce the luminous efficiency of the panel.

Document US 2002-060654 discloses a back-emitting panel in which the absorbent agent, instead of being distributed uniformly over the surface of the rear plate as in EP1 143 539, is distributed in grooves distributed over the entire surface of this rear plate; such a solution again does not solve the question of the distribution of the absorbent agent in top-emitting panels.

Finally, documents U.S. Pat. No. 5,239,228 and JP 2002-050471 disclose top-emitting electroluminescent panels whose transparent front plate includes a single groove around the perimeter, which groove is placed away from the active or emitting surface, and which contains an absorbent agent. The drawback of such a solution is that it does not ensure sufficiently homogenous distribution of the absorbent agent over the entire surface of the panel, this being particularly prejudicial in the case of large panels such as those with a diagonal that exceeds 20 cm.

SUMMARY OF THE INVENTION

It is an objective of the invention to avoid the aforementioned drawbacks in the case of top-emitting panels.

For this purpose, the subject of the invention is an image-display and/or lighting panel comprising two plates, a front plate facing the observer and a rear plate, these plates being sealed and leaving a sealed space between them; an array of cells that are capable of emitting light through the front plate and are distributed between these plates; and an active absorbent agent in this sealed space; characterized in that the said front plate includes, on its internal face corresponding to the face in contact with the sealed space, an array of cavities that are distributed between the said cells and contain the said absorbent agent.

The plate having the cavities is therefore the front plate, which plate is not in contact with the electroluminescent layer. This front plate is transparent, at least at each cell, and therefore the panel is a top-emitting panel; since the absorbent agent is distributed between the cells, especially in the non-emissive regions, it does not interact with the electroluminescent layer and does not impede the passage of the light through the front plate. Should separating barriers be present, the said absorbent agent lies on top of the barriers and, owing to their proximity, absorbs the traces of oxygen or water vapour, for example resulting from any outgassing of the constituent materials of the said separating barriers.

The invention remedies the problem of degradation of the light-emitting cells, for example by traces of oxygen and/or water vapour, by proposing that the absorbent agent be inserted between the light-emitting cells, especially opposite the non-emissive regions. Each cavity therefore lies between two adjacent light-emitting cells.

Separating barriers (also called "cathode separators") are generally placed between each light-emitting cell; they are placed so that the electrical pulses produced in each cell in order to generate the light emissions, and the light emissions themselves, do not reach the neighbouring cell. These barriers must therefore be made of an electrically and optically insulating material.

When separating barriers are present between the cells, the said absorbent agent is, according to the invention, not incorporated into the said barriers as in document JP11-054285; thus, there is therefore no risk of the absorbent agent modifying the composition and the properties thereof, nor of its interacting with the electroluminescent layer and of degrading it.

Preferably, each cell includes an organic electroluminescent layer that rests on the rear plate. "Top-emitting" panels are especially advantageous for the use of light extraction devices.

The absorbent agent will preferably be suitable for absorbing oxygen and/or water vapour.

According to a variant of the invention, the cavities consist of grooves; as a result, it is advantageous to place, between the light-emitting cells, grooves whose dimensions may be adjusted in order to contain a greater or lesser amount of absorbent agent in regions that are more sensitive to traces of oxygen and/or water vapour.

Since the light-emitting cells are generally distributed in rows and columns, each of the said grooves is preferably placed between two adjacent rows and/or two adjacent columns. The absorbent agent contained in the said grooves is thus advantageously placed and active in the spaces that require its action, without impeding the passage of the light through the front plate.

The surface defined by the array of cells constitutes the light-emitting active surface of the panel; according to a variant of the invention, the grooves extend over the entire width of the said surface, in the vertical and/or horizontal direction, on the internal face of the front plate of the panel. Advantageously, by means of a chequer-board arrangement of vertical and horizontal grooves, each placed between two adjacent columns or between two adjacent rows of cells, the absorbent agent contained in the said grooves is distributed very uniformly and in a very homogenous manner over the entire internal surface of the front plate.

Preferably, the front plate is made of glass, glass advantageously providing sufficient impermeability to oxygen and/or water vapour; it is furthermore possible to cut the cavities or grooves therein by standard lithography means, or by sandblasting or moulding, these being known per se, and to fill the cavities or grooves with the absorbent agent, during the upstream process for manufacturing the plate, thus incurring no significant increase in production costs nor any modification of the process for manufacturing the rear plate that includes the matrix of organic electroluminescent cells or OLEDs (organic light-emitting diodes).

The absorbent agent contained in a cavity or groove is preferably held fixed therein by means of a porous transparent adhesive film applied to all or part of the surface of the internal face of the front plate. The said film advantageously keeps the absorbent agent in place in the cavity or groove that it occupies, while still allowing the said absorbent agent to carry out its action in the sealed space.

The sealed space is preferably filled with an inert gas so as to avoid the formation or the growth of contaminants such as organic materials other than those contained in the organic electroluminescent cells for example.

The invention will be more clearly understood on reading the description that follows, given by way of non-limiting example, and with reference to the appended figures in which:

DETAILED DESCRIPTION OF THE PREFERRED EMBODIMENTS

Figure 1:
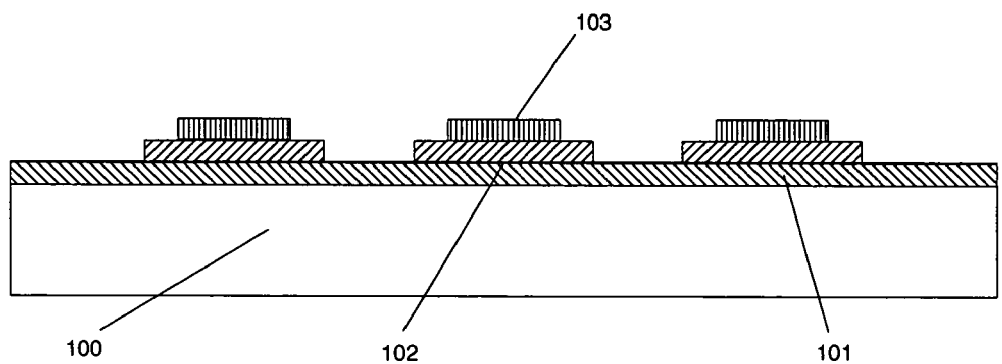
FIGS. 1 and 2 describe two embodiments of rear plates of "top-emitting" organic electroluminescent panels according to the invention, without separating barriers and with separating barriers respectively, before application of the front plate.

Electroluminescent panels are formed from an arrangement of light-emitting cells or light-emitting diodes called pixels or picture elements, deposited on a substrate. This arrangement of pixels is generally organized in a matrix of rows and columns, each pixel being located at the intersection of a row and a column. The intensity and the duration of the light emission may be controlled by passive or active means, known per se, that will not be described in detail here.

At the present time, there are three categories of electroluminescent cells, differentiated by the nature of their emitting surface, namely LEDs (light-emitting diodes), PLEDs (polymer light-emitting diodes) and OLEDs (organic light-emitting diodes). These electroluminescent panels are based on the same principle—they themselves produce light by virtue of radiative charge carrier recombination phenomena; a photon is then emitted with an emission frequency that depends on the material used.

LED cells are made of inorganic semiconductor materials, PLED cells are made of polymer-type organic materials and OLED cells are made of organic materials of low molecular mass.

An electroluminescent panel therefore generally comprises a substrate that supports a thin electroluminescent multilayer inserted between two arrays of electrodes—one an array of anodes and the other an array of cathodes—that are intended to supply the cells; each cell generally corresponds to a region of overlap of an anode and a cathode; for polychromatic, especially trichromatic, panels, the thin electroluminescent layer is generally divided into alternating stripes of different emission colours.

The substrate, generally made of glass or plastic, has in general a thickness of between 300 $\mu$m and 1500 $\mu$m, i.e. 100 to 500 times greater than that of the cells; the dimension or diameter of the cells or pixels is generally between 100 $\mu$m and 300 $\mu$m, i.e. 1 to 15 times less than the thickness of the substrate; the layer of electrodes that is inserted between the substrate and the electroluminescent layer is generally called the "bottom layer" since, in conventional manufacturing processes, it is applied before the electroluminescent layer; the other layer of electrodes, that is applied after the electroluminescent layer, is called the top layer"; in general, the stripes of the top layer of electrodes are parallel and centred on those of the electroluminescent layer, that they at least partly cover.

In "top-emitting" panels, the light is emitted through the top layer of electrodes.

The panel according to the invention therefore comprises:
two plates, a front plate facing the observer and a rear plate, that are sealed and leave between them a sealed space, an array of electroluminescent cells that are capable of emitting light through the front plate and are distributed between these plates; and
at least one of the two plates includes, on its internal face in contact with the sealed space, an array of cavities that are distributed between the said cells and contain an active absorbent agent in this sealed space.

The manufacture of an array of cells on a rear plate for a "top-emitting" panel will now be described with reference to FIGS. 1 and 2, without separating barriers with reference to FIG. 1 and with separating barriers with reference to FIG. 2, respectively; the array of cavities specific to the invention on the internal face of the front plate, and the absorbent agent that these cells contain, will be described later.

The first array of cells on the rear plate of a "top-emitting" panel, without separating barriers, with reference to FIG. 1, consists of a substrate 100 on which a bottom layer of electrodes 101, generally opaque and preferably reflective, is deposited, which layer is then etched to form stripes forming an array of, parallel cathodes. These stripes may be structured as several sublayers, for example a sublayer based on lithium fluoride (LiF) and a sublayer based on aluminium that provides the reflective effect; next, the organic electroluminescent layer 102 is deposited on the cathodes 101, for example using a mask or a set of masks to form stripes. The organic electroluminescent layer 102 is generally structured as several sublayers comprising, in particular, an organic electron-injection sublayer in contact with the cathodes, an actual organic electroluminescent sublayer, and a hole-injection sublayer in contact with the anodes. Deposited on top of the stripes of the organic electroluminescent layer is a transparent top layer 103 based on ITO (indium tin oxide) that is etched to form an array of parallel anodes deposited so as to cross the cathodes at each electroluminescent cell.

Figure 2:
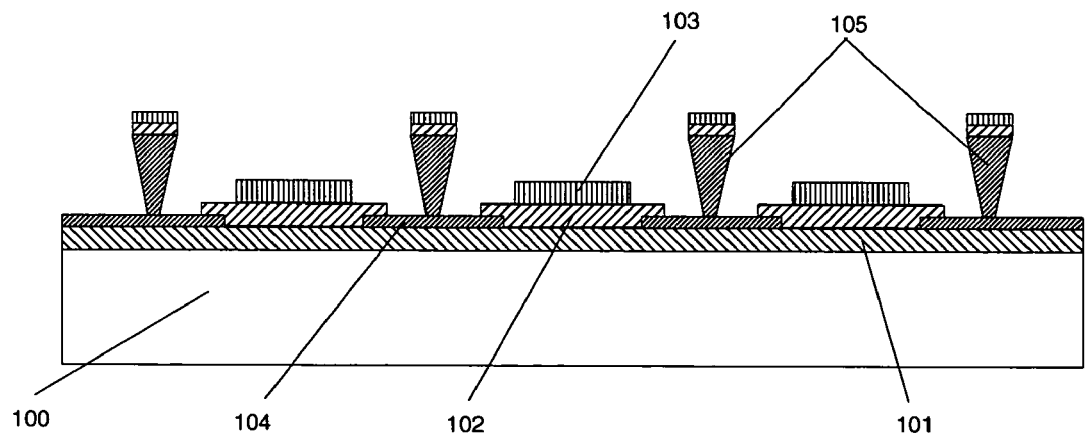

In the case of a "top-emitting" panel with separating barriers and with reference to FIG. 2, stripes of electrodes 101, acting as cathodes, are deposited, as previously, on a substrate 100; next, an electrical insulation layer 104 leaving gaps (or masked-off areas, in this case of rectangular shape, giving access to the stripes of electrodes 101 or cathodes is deposited; next, an array of straight parallel separating barriers 105 is produced, these being oriented perpendicular to the cathodes and placed between the masked-off areas or gaps in the insulation layer 104; possible methods of producing the separating barriers are described in document U.S. Pat. No. 5,701,055 (PIONEER); these barriers are made of insulating material. Next, the organic electroluminescent layer 102 is deposited on the cathodes in the gaps or masked-off areas and then the top layer 103 of electrodes based on ITO (indium tin oxide) is deposited on the organic electroluminescent layer 102 as described in the case of the manufacture of the rear plate of a "top-emitting" panel without separating barriers.

The separating barriers 105 have the advantage of electrically and also optically isolating the electroluminescent cells located on either side of the said barriers.

Various conventional methods may be used to deposit the various abovementioned layers; for example, it is possible to use vacuum deposition with masking, spin-coating deposition and/or ink-jet printing.

The emissive region 112 of a light-emitting cell is conventionally defined by the intersection of a row and a column of electrodes.

The manufacture of the front plate 106 of the same panel, which includes cavities cavities according to the invention, will now be described with reference to FIG. 3. The front plate 106, which is transparent so that the light emitted by the electroluminescent cells passes through it, the emissive regions 112 of a few representative cells of which are shown in dotted lines, covers the light-emitting active surface of the panel, in other words the surface containing all the electroluminescent cells. The said plate is generally made of glass, which material meets the requirements of impermeability to the elements such as oxygen and/or water vapour and does not impede the passage of the light. However, it is possible to use any type of transparent material that can meet the abovementioned requirements. Glass also has other advantages—it is easy to work, is scratch resistant and of low cost. The front plate 106 has dimensions, as mentioned above, such as to cover the light-emitting surface of the panel, which has a minimum area called the active emitting area of the panel, the area of the front panel 106 generally being greater than the active emitting area of the panel.

According to the invention, cavities 107 are provided on the internal face of the plate 106; these cavities are produced by known etching, lithography or moulding methods and then filled with an absorbent agent 108; the process for manufacturing the cavity glass plate according to the invention incorporates, right from the start of it, upstream, the provision of the said cavities 107 and of the absorbent agent 108 that they contain, independently of the other parts making up the panel. The cavities 107 are provided on this front plate in such a way that, after application of the front plate to the rear plate of the panel, they are opposite the non-emissive regions, between the emissive regions 112 corresponding to the organic electroluminescent cells 102. The measurement and adjustment means will not be described here as they are known per se.

Thus, since the cavities 107 in no way encroach on the emissive regions 112, this advantageously avoids any obstruction to the passage of light emitted by the cells.

The dimensions of the cavities 107 will be chosen according to the amount of absorbent agent 108 needed to protect the organic electroluminescent cells 102 from the traces of oxygen and/or water vapour, so as to have an image display panel with a lifetime that the invention proposes to improve. The maximum limits of the dimensions of the cells 107, on the internal face of the front plate 106, are defined by the non-emissive regions located between the emissive regions 112 of two adjacent electroluminescent cells, which cavities 107 must not impede the passage of the light through the front plate 106.

According to the invention, the array of cavities 107 contains an absorbent agent 108 selected so as to absorb the traces of oxygen and/or water vapour that may come from outside, through the walls, that is to say through the substrate 100, of the front plate 106 or the lateral regions 109 responsible for maintaining the seal between the substrate and the front plate, and/or emanating from degradation of the internal materials in the sealed space 111, and especially from any outgasing of the separating barriers 105.

It will be possible to use an absorbent agent or desiccator in the form of silica gel powder for example, and more generally a compound in powder, solid or thin-film form from the family of alkali metal oxides, or from the family of alkaline-earth metal oxides, or from the family of metal sulphates or halogens, or else from the family of perchlorates.

The absorbent agent 108 introduced into the cavities or grooves must remain fixed therein so that no part of this absorbent agent can contaminate the sealed space 111 throughout the lifetime of the panel. A porous transparent adhesive film 110 may be applied to all or part of the surface of the internal face of the front plate, taking care that the film 110 keeps the absorbent agent 108, contained in the cavities or grooves 107, fixed in place.

Depending on the embodiment chosen, the transparent porous adhesive film 110 occupies the entire surface of the internal face of the panel or, in the case of the fourth embodiment for example, the absorbent agent 108 of each cavity or groove 107 is held in place by a porous transparent adhesive film 110 of sufficient size to keep the absorbent agent 108 in place in the cavity or groove 107 that it occupies.

Figure 5:
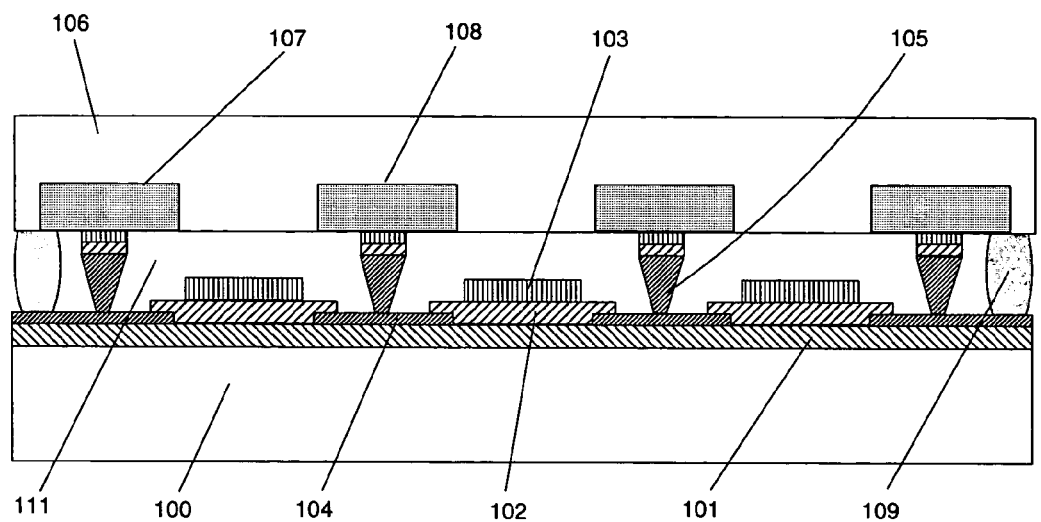

According to a variant, the absorbent agent in solid form contained in a cavity or groove 107 is, in the case of a top-emitting panel with a rear plate provided with separating barriers 105, kept trapped in the cavities or grooves 107 by contact with the top of the separating barrier 105 facing the cavity or groove 107, without having recourse to another fixing means. This variant is shown schematically in FIG. 5.

The cavities or cells 107 are provided on the plate, facing the non-emissive regions, according to several non-limiting embodiments that will now be described.

Figure 3:
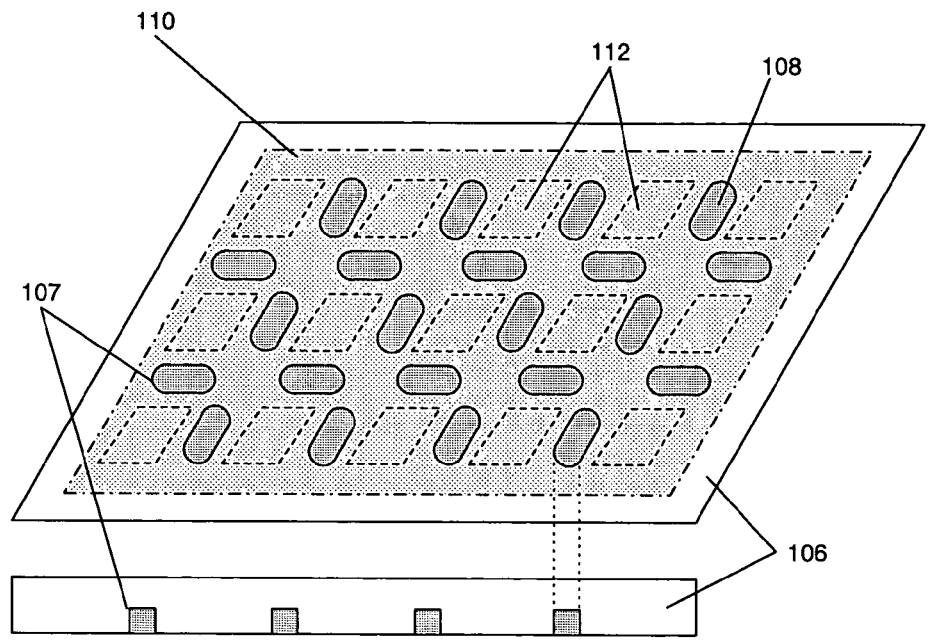
FIG. 3 describes a first embodiment of a front plate of an organic electroluminescent panel according to the invention.
Figure 4:
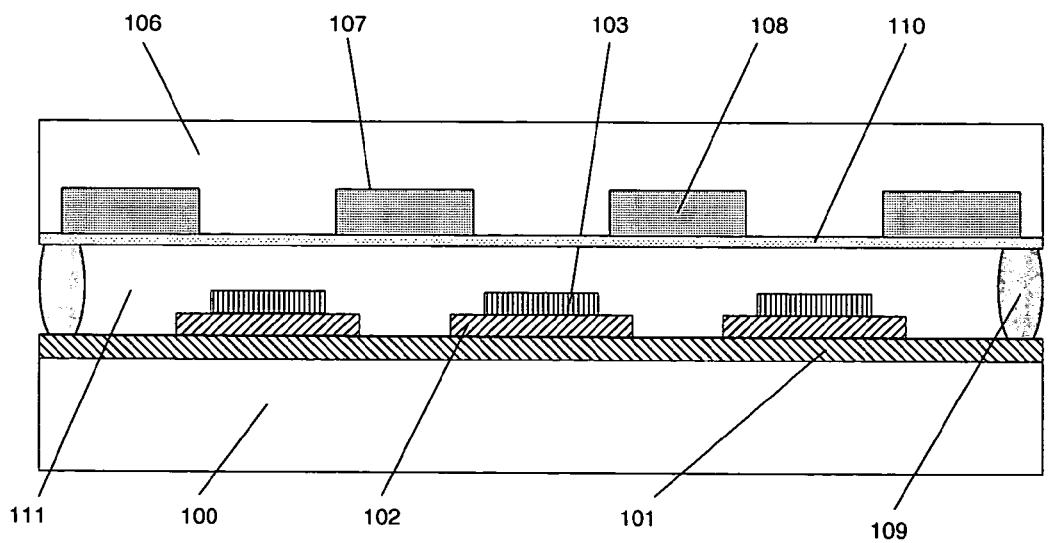
FIGS. 4 and 5 describe "top-emitting" organic electroluminescent panels according to the invention, obtained with the front plate of FIG. 3 and with the rear plate of FIGS. 1 and 2, respectively.

First Embodiment:

Referring to FIG. 3, each cavity 107 is positioned, by the means described above, between two adjacent electroluminescent cells of one and the same row and/or of one and the same column of cells. FIG. 3 illustrates more specifically the case where there is a cavity between two cells of two adjacent rows and a cavity between two cells of two adjacent columns.

Figure 6:
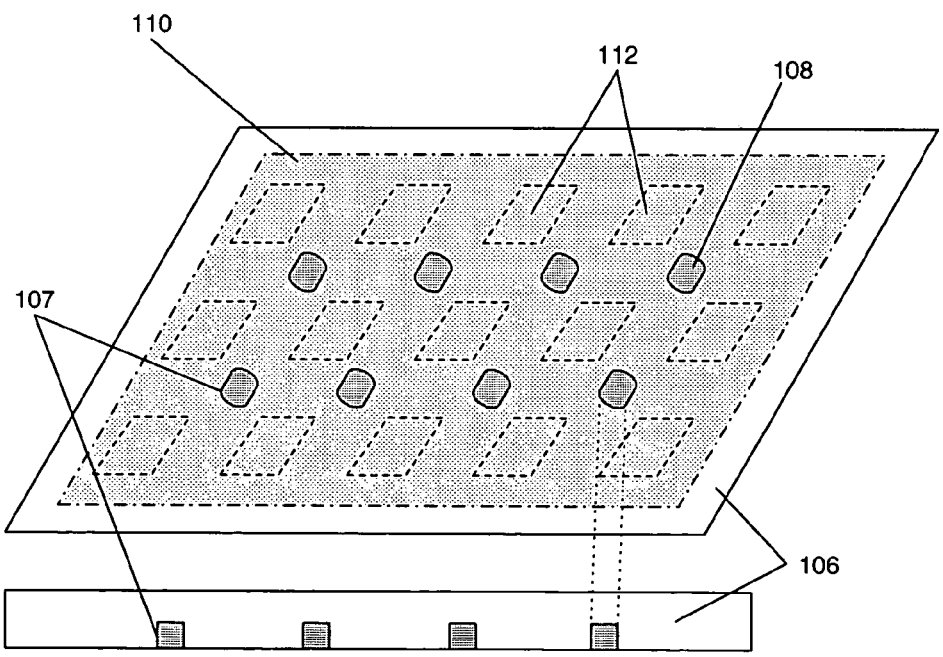
FIGS. 6 to 10 describe the front plate according to different families of embodiments of the invention.

Second Embodiment:

Referring to FIG. 6, each cavity 107 is positioned between two transversely adjacent electroluminescent cells 102, in other words between two adjacent electroluminescent cells 102 that do not belong either to the same row or to the same column of cells.

Figure 7:
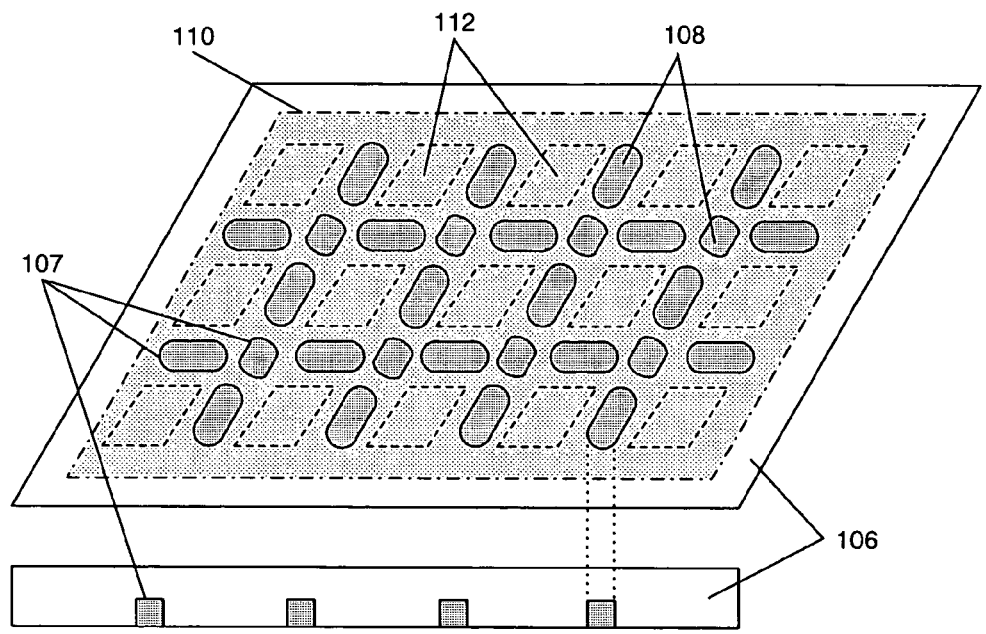

Third Embodiment:

With reference to FIG. 7, the cavities 107 are positioned on the internal face of the front plate, over the entire active surface of the panel, according to the first and second embodiments. Here, there is an array of cavities 107 that are positioned in such a way that each electroluminescent cell 102 other than the last one of a row or of a column is surrounded by eight cavities.

Figure 8:
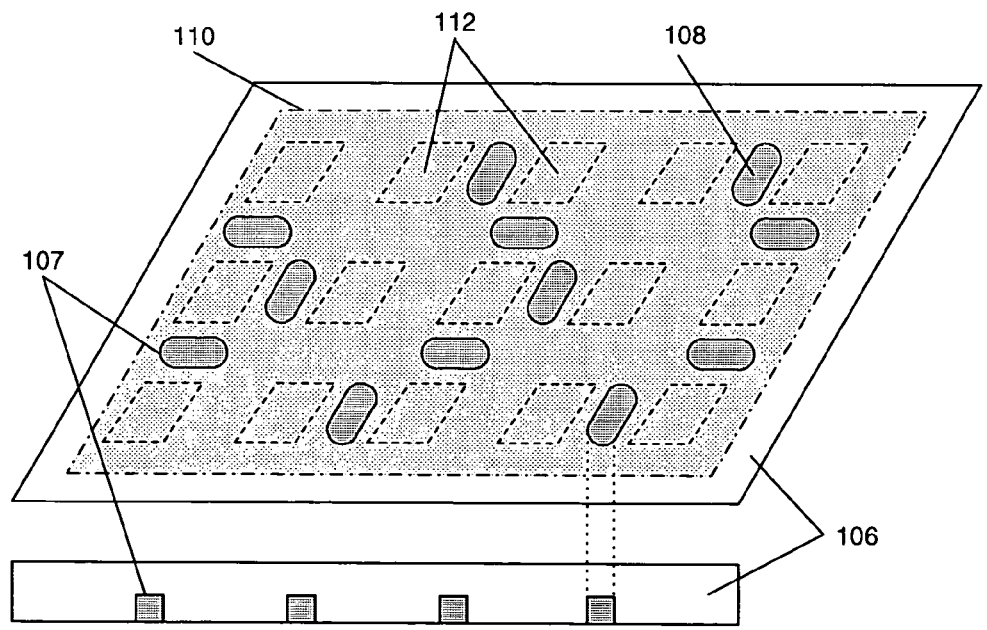

Fourth Embodiment:

Referring to FIG. 8, this shows a front plate 106 in which cavities 107 are positioned according to any one of the previous embodiments, except that, and this is a non-limiting example, instead of a cavity 107 being positioned between two electroluminescent cells, a cavity 107 is positioned between two groups of two or three or four or n electroluminescent cells.

Figure 9:
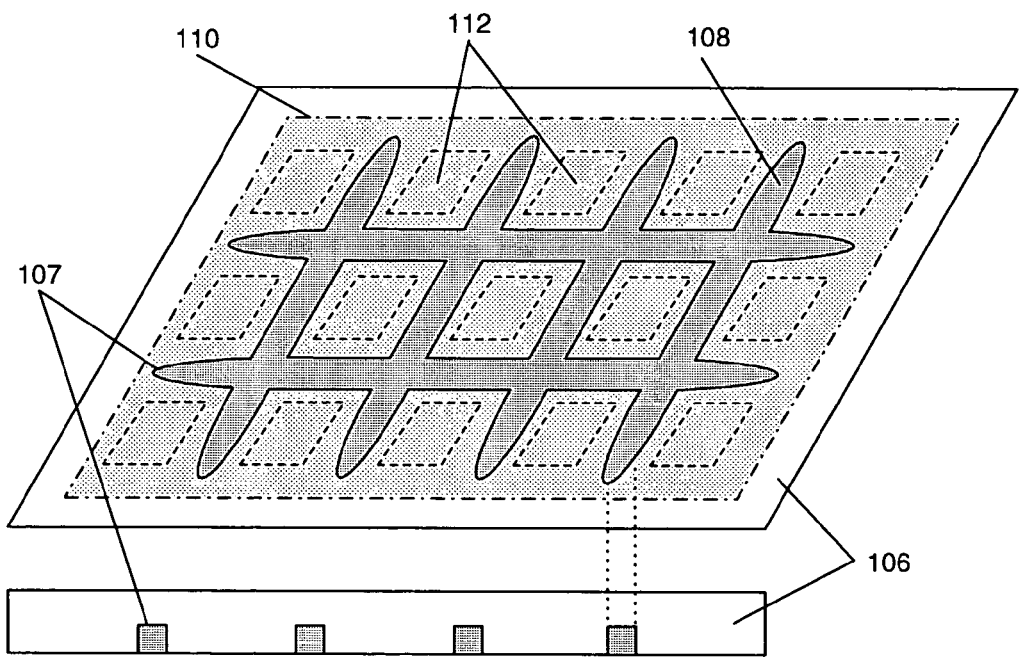

Fifth Embodiment:

Referring to FIG. 9, the cavities 107 form grooves and, similarly to the first, second or third embodiments, are positioned between two adjacent rows and/or two adjacent columns of cells. When each groove 107 has as width the active light-emitting surface, a chequer-board pattern of emissive regions 112 of the electroluminescent cells is obtained over the entire active emitting area of the panel.

Figure 10:
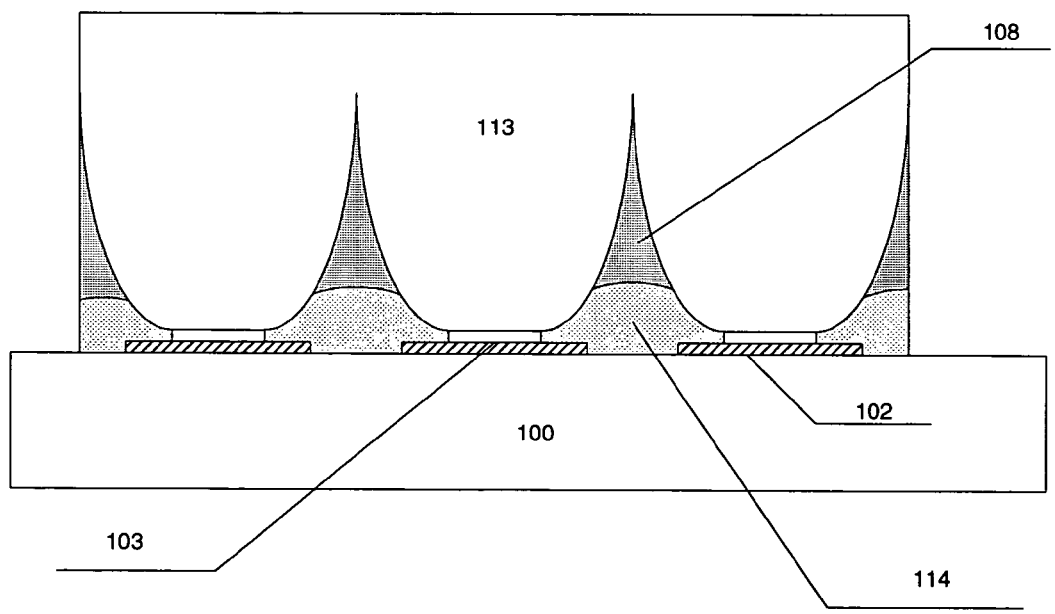

Sixth Embodiment:

In this embodiment, the front plate is provided with light extractors operating by reflection, such as those described in the documents U.S. Pat. No. 6,091,384 and U.S. Pat. No. 6,229,160; with reference to FIG. 10, this plate is formed from an array of extractors 113 that leave between them cavities partly filled with absorbent agent 108; the inlet of each extractor coincides with the emissive region of a cell, especially an electroluminescent layer element 103; a layer of adhesive 114, having a matched index, serves as I ink between the emissive regions and the extractor inputs, and extends into the cavities, as indicated in the figure.

Finally, the cavities or grooves 107 are, according to any one of the previous embodiments, judicially positioned on the internal face of the front plate 106 in regions in which the action of the absorbent agent is necessary, without impeding the passage of the light generated by the emissive region 112 of each organic electroluminescent cell 102 through the front plate 106.

An electroluminescent panel according to the invention is then obtained by precisely adjusting the front plate 106 that is judicially provided with cavities or grooves 107 filled with the absorbent agent, on the rear plate that may or may not be provided with separating barriers, in such a way that the cavities or grooves 107 actually occupy regions facing the non-emissive regions, between the emissive regions 112 of two adjacent electroluminescent cells, the face of the front plate that is provided with cavities or grooves 107 being turned towards that face of the rear plate which contains the organic electroluminescent cells 102.

When the adjustment of the front plate 106 with respect to the rear plate has the abovementioned characteristics, the edges of the two plates are sealed or bonded by means known per se under a controlled atmosphere, for example in a glove box, and an inert gas is introduced into the sealed space 111 thus created.

As a non-limiting example, the area of a light-emitting cell or emissive region 112, defined by the intersection of a line and a column of electrodes, is about 80 $\mu$m (microns) by 240 $\mu$m, i.e. 19200 $\mu m^2$.

The distance between the edges of the emissive regions of two adjacent cells of any one column of electrodes is conventionally 20 $\mu$m and the distance between the edges of the emissive regions of two adjacent columns of any one row of electrodes is conventionally 60 $\mu$m. The area of the non-emissive region surrounding the emissive region of a cell is therefore conventionally:

$$(300 \times 100) - (80 \times 240) = 10800 \ \mu m^2.$$

For a cell, the maximum area that the cavities or grooves 107 containing the absorbent agent 108 on the internal face of the front plate 106 can occupy is therefore equal to the non-emissive area, i.e. 10800 $\mu m^2$.

When separating barriers 105 are present, the distance between the edge of a barrier and the edge of the emissive region of a cell is conventionally 20 $\mu$m. The area of the non-emissive region surrounding an emitting cell, not masked by or in contact with the separating barriers on either side of the cell, is therefore conventionally:

$$(280 \times 100) - (80 \times 240) = 8800 \ \mu m^2.$$

For each cell, the maximum area that the cells or cavities 107 containing the absorbent agent 108 on the internal face of the front plate 106 can occupy remains equal to the non-emissive area, i.e. 10800 $\mu m^2$, except that, in the case in which separating barriers 105 are present, when part of this area, about 2000 $\mu m^2$ facing or in contact with the separating barriers, includes cavities or cells containing the absorbent agent, the said absorbent agent is ideally localized in order to absorb traces of water vapour and/or oxygen resulting from any outgasing of the constituent materials of the separating barriers 105. There then remains a non-emissive area of about 8800 $\mu m^2$ that can contain cavities or grooves 107 containing the absorbent agent 108 in order to absorb any trace of oxygen or water vapour close to the organic electroluminescent layer 102.

The thickness of the front plate 106 is generally between 700 $\mu$m and 1000 $\mu$m.

The advantages of the invention will now be summarized:

the lifetime of the organic electroluminescent cells or OLEDs 102 is improved by the presence of the absorbent agent 108 between the emissive regions 112 of the cells, on the internal face of the front plate 106;

the absorbent agent 108 is placed in regions that do not impede the passage of the light, where its action is necessary;

the absorbent agent 108 is distributed uniformly and homogenously over the entire active surface of the panel;

the cavities or grooves 107 are etched in the front plate and filled with absorbent agent 108 upstream of the manufacturing process, thereby incurring no significant increase in costs and not modifying the process for manufacturing the rear plate containing the electroluminescent cells, whether they be of the OLED, PLED or more generally LED type; and the absorbent agent 108 is not incorporated into the separating barriers 105.

What is claimed is:

1. Image-display and/or lighting panel comprising:

two plates, a front plate facing the observer and a rear plate, these plates being sealed and leaving a sealed space between them;

an array of electroluminescent cells that are capable of emitting light through the front plate and are distributed between these plates; and an active absorbent agent in this sealed space;

characterized in that the said front plate includes, on its internal face corresponding to the face in contact with the sealed space, an array of cavities that are distributed between the said cells and contain the said absorbent agent.

2. Image-display and/or lighting panel according to claim 1, characterized in that the said cavities form grooves.

3. Image-display and/or lighting panel according to claim 2, characterized in that, when the said cells are distributed in rows and columns, each of the said grooves is placed between two adjacent rows and/or between two adjacent columns.

4. Image-display and/or lighting panel according to claim 2, characterized in that the said grooves extend over the entire width of the surface defined by the array of cells.

5. Panel according to claim 1, characterized in that each cell includes an organic electroluminescent layer that rests on the said rear plate.

6. Image-display and/or lighting panel according to claim 1, characterized in that the absorbent agent is suitable for absorbing oxygen and/or water vapour.

* * * * *